(12) United States Patent
Sung et al.

(10) Patent No.: US 11,784,251 B2
(45) Date of Patent: Oct. 10, 2023

(54) TRANSISTORS WITH FERROELECTRIC SPACER AND METHODS OF FABRICATION

(71) Applicant: Intel Corporation, Santa Clara, CA (US)

(72) Inventors: Seung Hoon Sung, Portland, OR (US); Gilbert Dewey, Hillsboro, OR (US); Abhishek Sharma, Hillsboro, OR (US); Van H. Le, Beaverton, OR (US); Jack Kavalieros, Portland, OR (US)

(73) Assignee: Intel Corporation, Santa Clara, CA (US)

(*) Notice: Subject to any disclaimer, the term of this patent is extended or adjusted under 35 U.S.C. 154(b) by 877 days.

(21) Appl. No.: 16/457,752

(22) Filed: Jun. 28, 2019

(65) Prior Publication Data
US 2020/0411695 A1 Dec. 31, 2020

(51) Int. Cl.
| | |
|---|---|
| H01L 29/78 | (2006.01) |
| H01L 29/66 | (2006.01) |
| H10B 61/00 | (2023.01) |
| H10B 63/00 | (2023.01) |

(52) U.S. Cl.
CPC .... *H01L 29/78391* (2014.09); *H01L 29/6684* (2013.01); *H10B 61/00* (2023.02); *H10B 63/00* (2023.02)

(58) Field of Classification Search
CPC ........... H01L 29/78391; H01L 29/6684; H01L 27/222; H01L 27/24
See application file for complete search history.

(56) References Cited

U.S. PATENT DOCUMENTS

| | | | |
|---|---|---|---|
| 6,348,709 B1* | 2/2002 | Graettinger | H01L 27/11502 257/E21.507 |
| 2010/0265749 A1* | 10/2010 | Wang | H01L 45/14 257/421 |
| 2018/0053830 A1* | 2/2018 | Cheng | H01L 29/40111 |
| 2019/0103474 A1* | 4/2019 | Toh | H01L 29/66795 |
| 2019/0115441 A1* | 4/2019 | Tan | H01L 29/6656 |
| 2020/0091160 A1* | 3/2020 | Ino | H01L 27/11507 |

* cited by examiner

Primary Examiner — Christine A Enad
(74) Attorney, Agent, or Firm — Essential Patents Group, LLP

(57) ABSTRACT

A transistor includes a semiconductor body including a material such as an amorphous or polycrystalline material, for example and a gate stack on a first portion of the body. The gate stack includes a gate dielectric on the body, and a gate electrode on the gate dielectric. The transistor further includes a first metallization structure on a second portion of the body and a third metallization structure on a third portion of the body, opposite to the second portion. The transistor further includes a ferroelectric material on at least a fourth portion of the body, where the ferroelectric material is between the gate stack and the first or second metallization structure.

13 Claims, 12 Drawing Sheets

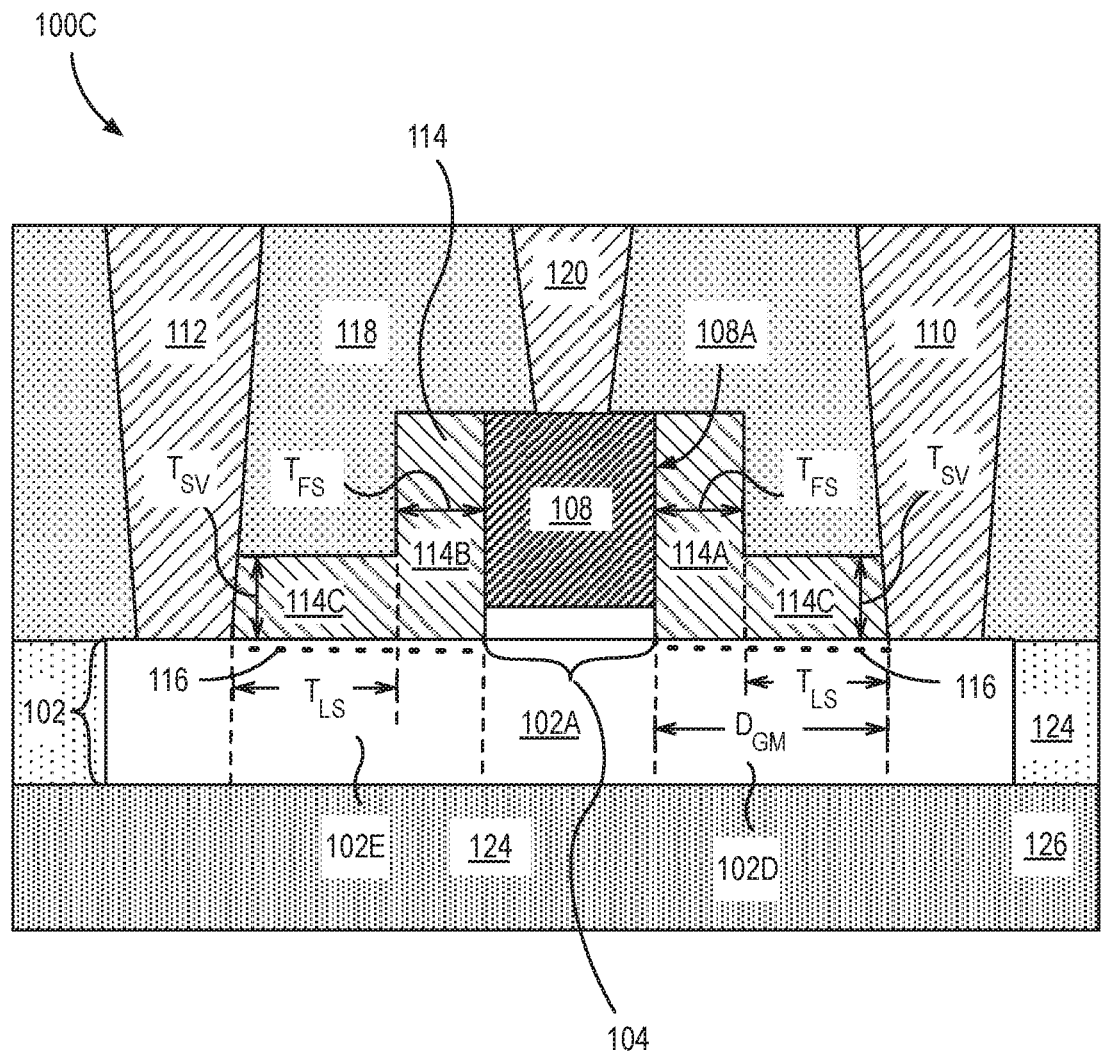
FIG. 1C
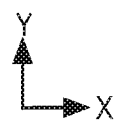

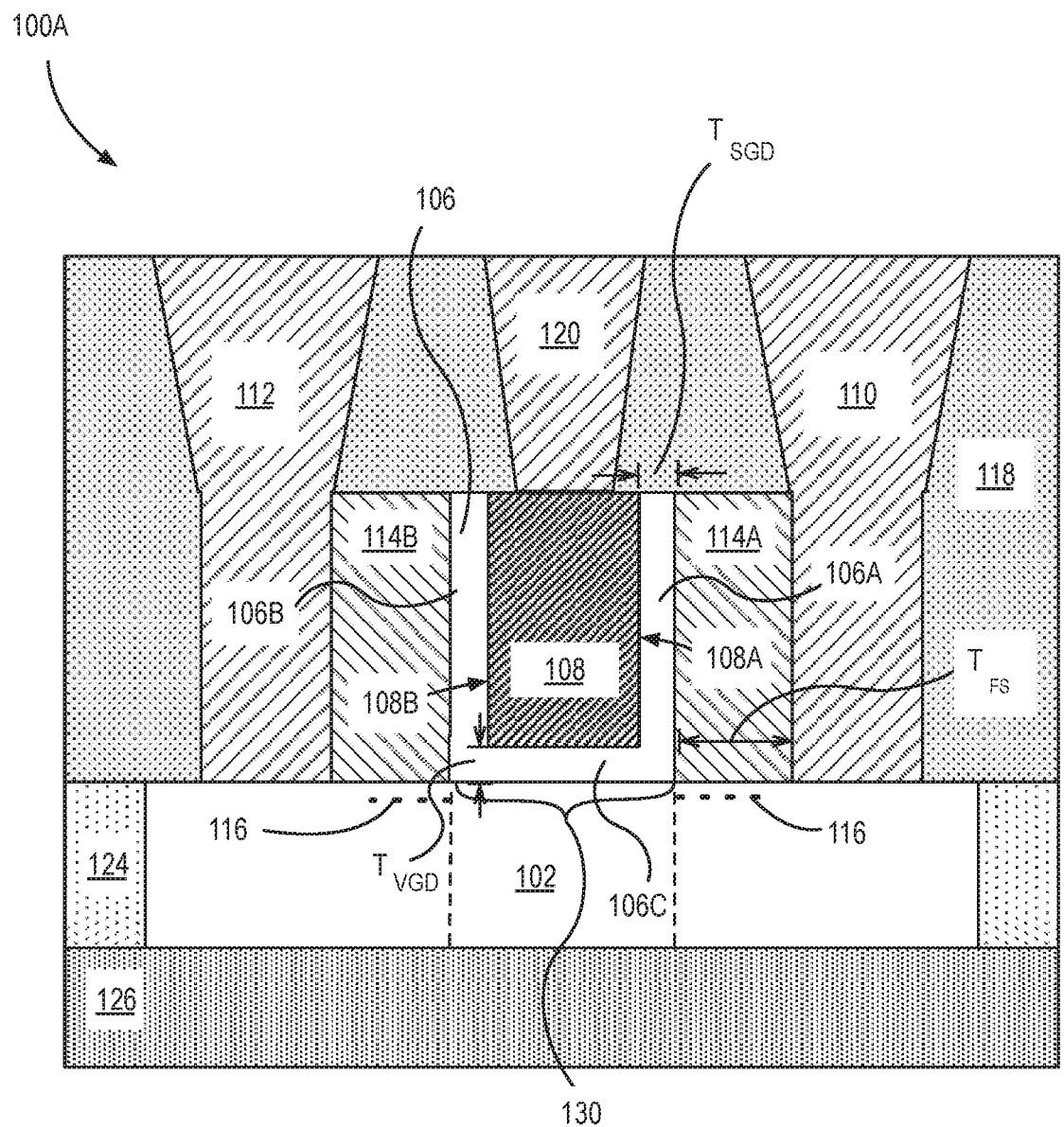
FIG. 1D
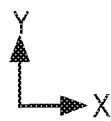

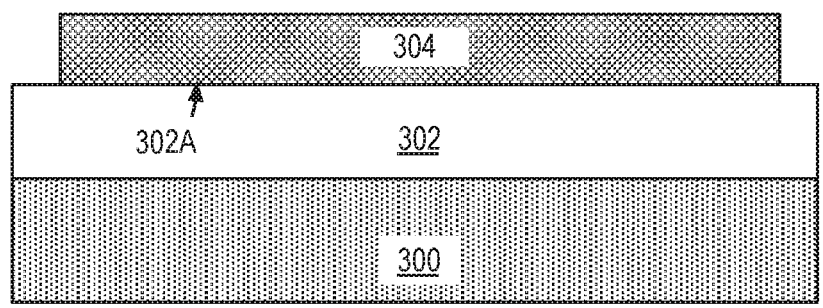
FIG. 3A
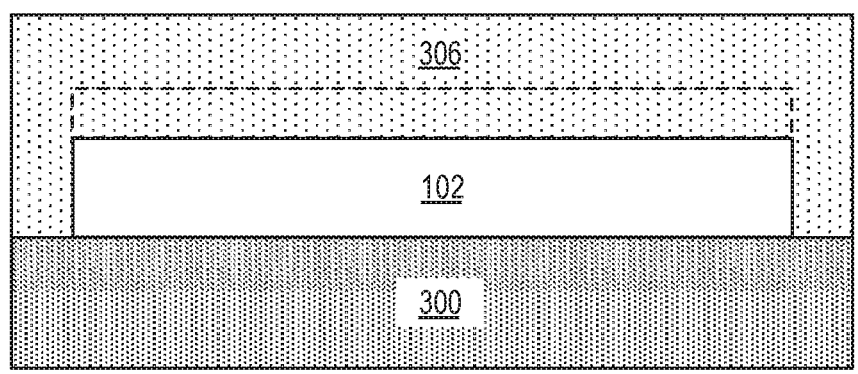
FIG. 3B
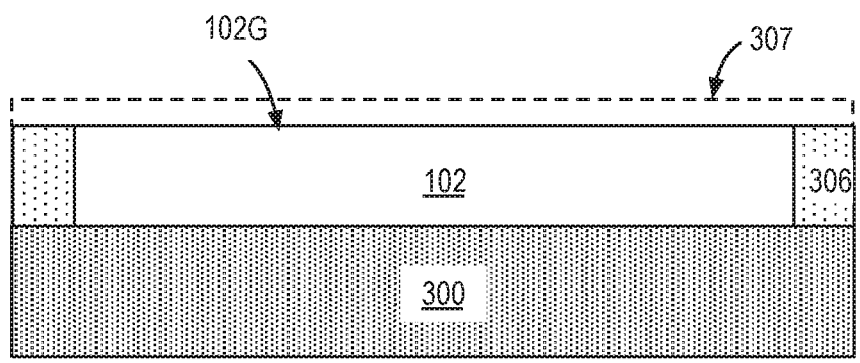
FIG. 3C
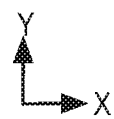

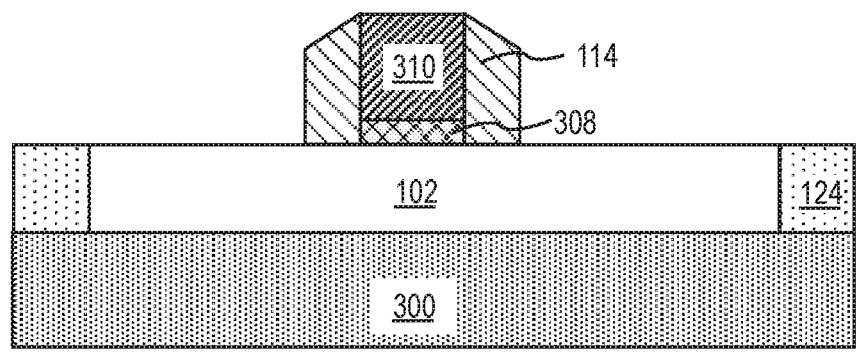
FIG. 3D
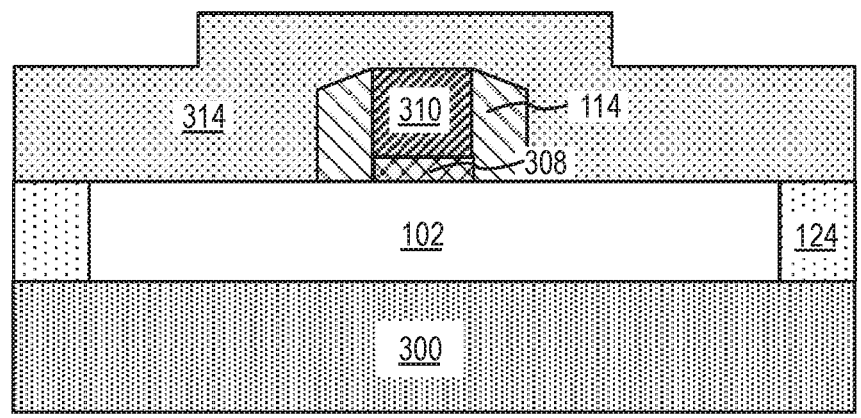
FIG. 3E
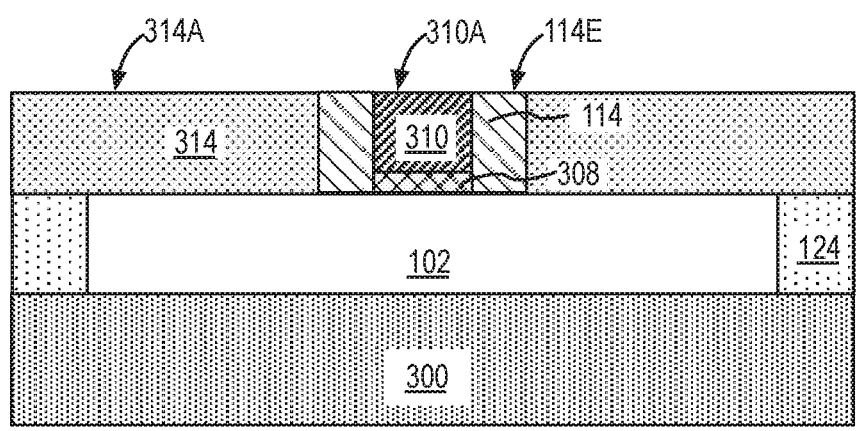
FIG. 3F
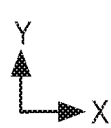

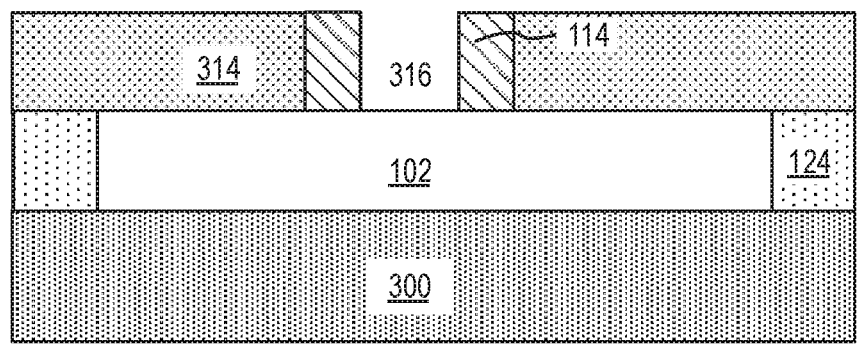
FIG. 3G
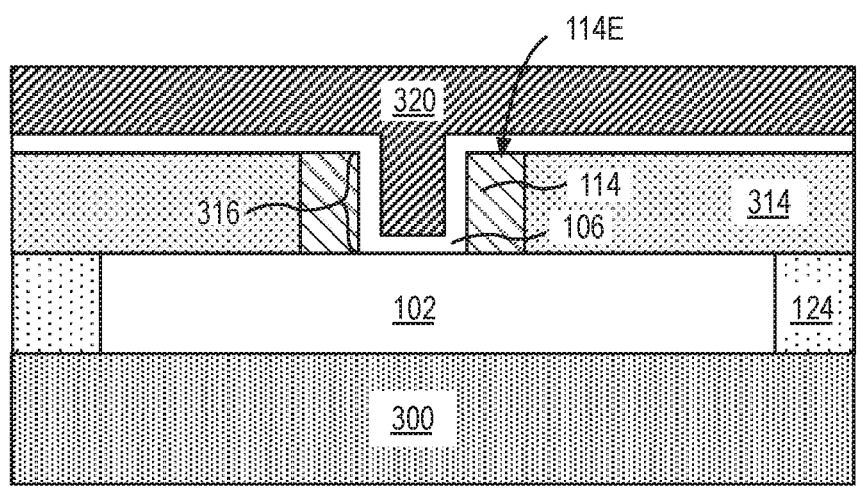
FIG. 3H
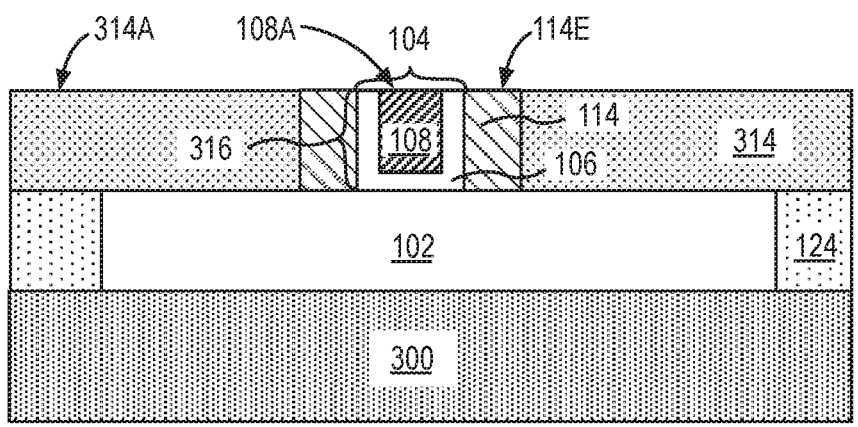
FIG. 3I

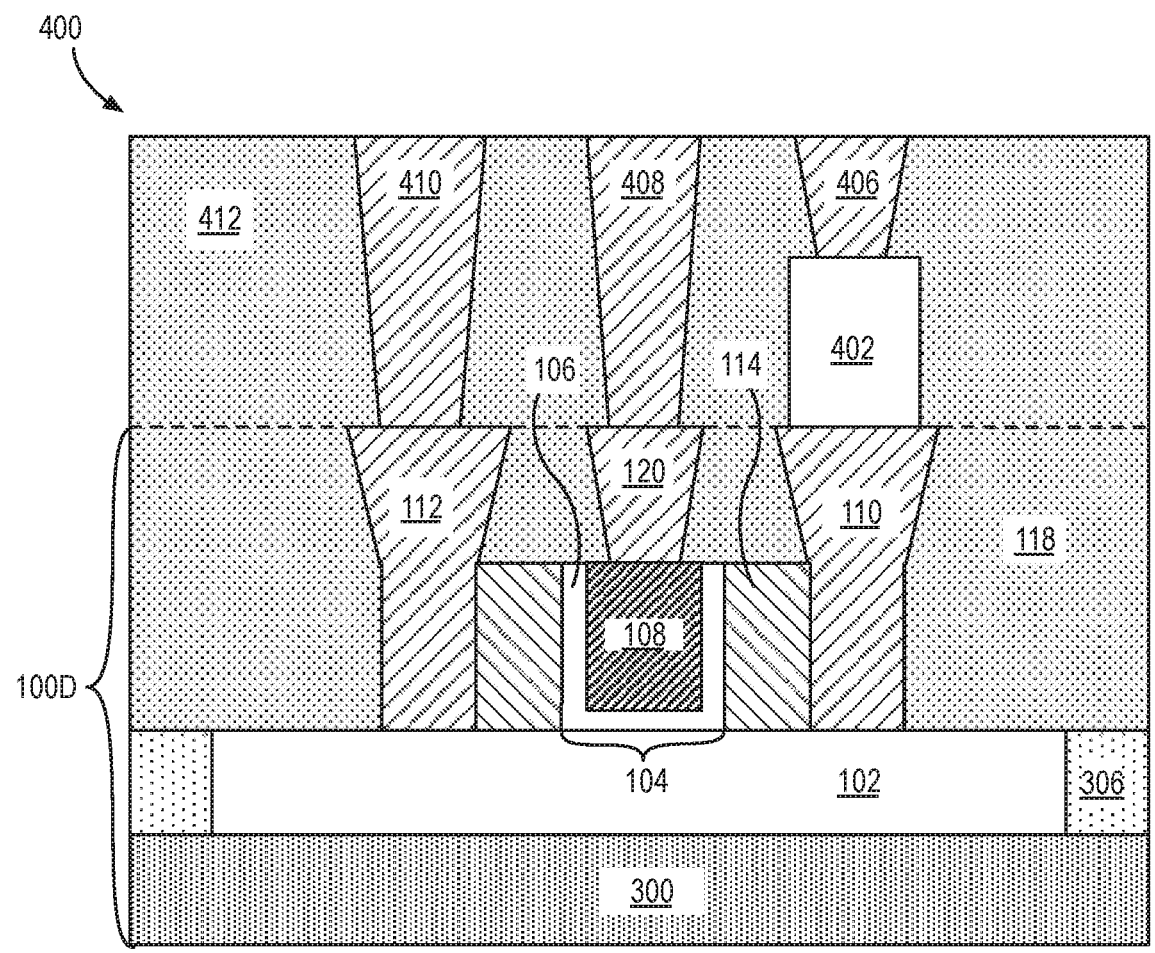
FIG. 4A
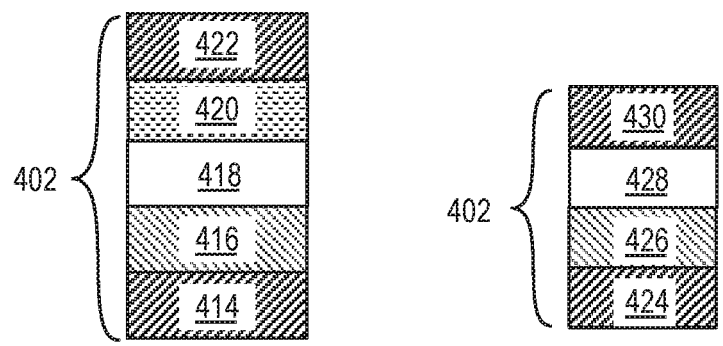
FIG. 4B
FIG. 4C

TRANSISTORS WITH FERROELECTRIC SPACER AND METHODS OF FABRICATION

BACKGROUND

High performance transistors may utilize materials other than silicon for channel Such transistors may have limitations for reducing resistance between drain and gate, for example, during operation.

Therefore, there is a continuing need for transistors with reduced off state current and increased drive current in the on state. It is with respect to these and other considerations that the present improvements are needed. Such improvements may become critical as the desire for improved transistor performance becomes more widespread.

BRIEF DESCRIPTION OF THE DRAWINGS

FIG. 1C illustrates a cross-sectional view of a transistor including a ferroelectric spacer having a sidewall portion adjacent to a gate stack and a lateral portion connected to the sidewall portion, where the metallization structure is directly adjacent to ferroelectric spacer.

FIG. 1D illustrates a cross-sectional view of a transistor including a gate dielectric layer having a first portion between the gate electrode and a channel material and a second portion directly between a gate electrode and a ferroelectric spacer.

FIG. 3A illustrates a cross-sectional view of a semiconductor material formed above a substrate.

FIG. 3B illustrates the structure of FIG. 3A following the process to pattern the semiconductor material and formation of a dielectric on the patterned semiconductor material.

FIG. 3C illustrates a cross-sectional view of the structure of FIG. 3B following the process of forming an isolation around the body structure.

FIG. 3D illustrates a cross-sectional view of the structure of FIG. 3C following the formation of a dummy gate dielectric layer on the substrate, the formation of a dummy gate on the dummy gate dielectric layer, and the formation of a ferroelectric spacer adjacent to the dummy gate dielectric layer and the dummy gate, in accordance with an embodiment of the present disclosure.

FIG. 3E illustrates the structure of FIG. 3D following the deposition of a dielectric on the ferroelectric spacer on the dummy gate electrode, on sidewalls of the dummy gate dielectric layer, on the body structure and on the isolation.

FIG. 3F illustrates the structure of FIG. 3E following planarization of the dielectric, upper portions of the ferroelectric spacer and upper portions of the dummy gate.

FIG. 3G illustrates the structure of FIG. 3F following removal of the dummy gate and dummy gate dielectric layer selectively to the ferroelectric spacer to form an opening.

FIG. 3H illustrates the structure of FIG. 3G following a deposition of a gate dielectric layer into the opening, on a top surface of body structure within opening, on sidewalls of ferroelectric spacer within the opening, on dielectric spacer surface, and on a top or an uppermost dielectric surface.

FIG. 3I illustrates the structure of FIG. 3H following a planarization process to form a gate stack including a gate electrode and gate dielectric layer.

FIG. 4A illustrates a cross-sectional view of a memory cell including a transistor with a ferroelectric spacer and a non-volatile memory element coupled to a metallization of the transistor.

FIG. 4B illustrates a cross-sectional view of an example non-volatile memory element that includes a magnetic tunnel junction (MTJ) material device.

FIG. 4C illustrates a cross-sectional view of an example non-volatile memory element that includes a resistive random-access memory (RRAM) device.

DESCRIPTION OF THE EMBODIMENTS

Figure 1A:
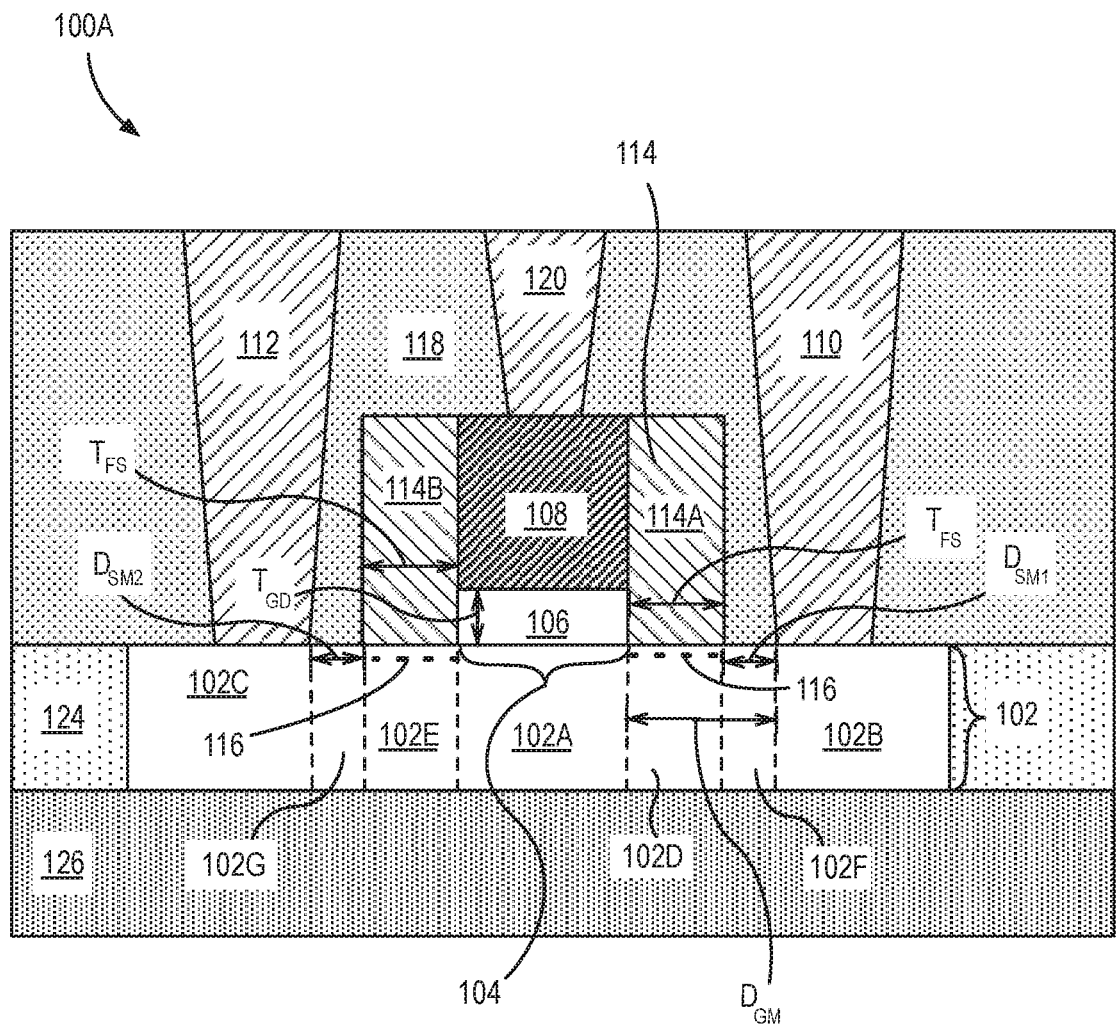
FIG. 1A illustrates a cross-sectional view of a transistor including a ferroelectric spacer.

A transistor structure with a ferroelectric spacer and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As transistors are scaled, optimizing transistor drive current while operating the transistor at low voltages is highly desirable. Low voltage operation may lend to power savings. For example, one method to increase the drive current is to thin the gate dielectric layer as the drive current is inversely proportional to the thickness of the gate dielectric. However, thinning of gate dielectric layer can also lead to an increase in leakage current as electrons can tunnel through a thin gate dielectric layer. The drive current of a transistor may also be increased by increasing the gate voltage on the transistor, in conjunction with increasing the drain bias voltage with respect to the source. However, this leads to increased power consumption, source-drain leakage and gate leakage.

However, this situation may be mitigated by replacing a conventional dielectric spacer with a spacer including a ferroelectric material (herein ferroelectric spacer). As discussed further herein a ferroelectric spacer may induce charge in an ungated region of a channel material through the principle of spontaneous electric polarization. The atoms in the ferroelectric material are said to be spontaneously polarized when the electron clouds in the atoms are shifted relative to their respective nuclei. The spontaneous polarization leads to the creation of electric dipoles. The net effect of all the dipoles is the creation of a polarization induced electric field. This electric field may, in turn, induce static charges within a channel material under the ferroelectric spacer. Depending on the material and/or microstructure of the ferroelectric layer, the magnitude of the internal electric field may be sizable enough to appreciably invert the ungated material under the spacer. The amount of charge induced in the channel under the ferroelectric spacer may therefore be determined by the ferroelectric material and/or how that material is formed. Furthermore, because the charges in the channel material under the ferroelectric spacer are static a drive current in the channel only manifests when the drain is biased relative to the source ($V_{DS}$) and gate is biased relative to source and/or drain ($V_{GS}$ or $V_{DS}$). Having a ferroelectric spacer above a channel may also be advantageous because the static charge build-up at a vicinity of ferroelectric spacer and a gate stack (gate electrode and gate dielectric layer), enables a small gate bias to a cause higher charge injection velocity.

Noting the electron cloud in the ferroelectric material can be shifted by an externally applied electric field, such as a field generated from an application of a gate voltage relative to a source or drain contact. If a voltage bias is sufficiently high, the direction of the spontaneous polarization can be tuned by the voltage bias. The applied electric field (due to the voltage bias) can manipulate the direction of the polarization field in the ferroelectric spacer. A direction of the internal electric field might then be set in the ferroelectric spacer at the beginning of the transistor operation, or potentially reset at any time.

In an embodiment of the present disclosure, a transistor includes a semiconductor body including a material such as an amorphous, polycrystalline or monocrystalline material, for example, and a gate stack on a first portion of the body. The gate stack includes a channel-compatible gate dielectric on the body, and a gate electrode on the gate dielectric. The transistor further includes a first metallization structure on a second portion of the body and a third metallization structure on a third portion of the body, opposite to the second portion. The transistor further includes a ferroelectric material fourth and fifth portions of the body between the gate and the first metallization structure and between the gate and the second metallization structure, respectively. In an unbiased state, the atoms in the ferroelectric spacer may be polarized. Upon application of a one-time gate bias voltage, the orientation of the electric dipoles in the ferroelectric spacer can be set with the direction of the orientation dependent on the polarity of the applied gate bias relative to the first and the second metallization structures. The resultant electric field induces charges in the fourth and fifth portions of the body under the ferroelectric spacer. During operation, when a bias is applied to the first (the second) metallization structure relative to the second (the first) metallization structure and the gate is biased above a threshold voltage for current to flow in the channel material. The charge induced in the vicinity of the first portion and fourth portion of the body, and between the first portion and the fifth portion of the body by the polarized electric field may reduce electrical resistance between the first and second metallization structures. The ferroelectric spacer can be readily adapted to complimentary CMOS logic transistor applications because the sign of the charge carriers induced (and consequently the polarity of the gate bias during operation) can be set.

FIG. 1A illustrates a cross-sectional view of a transistor 100A, in accordance with an embodiment of the present disclosure. In an exemplary embodiment, the transistor 100A includes a body 102 including a semiconductor, a gate stack 104 on a first portion 102A of the body 102. The gate stack 104 includes a gate dielectric 106 on the body 102, and a gate electrode 108 on the gate dielectric 106. The transistor 100A further includes a metallization structure 110 on a second portion 102B of the body and a metallization structure 112 on a third portion 102C of the body 102. As shown body portion 102A is between body portion 102B and body portion 102C. The transistor 100A further includes a ferroelectric material 114 on at least a fourth portion 102C of the body 102, where the ferroelectric material 114 is between the gate stack 104 and the metallization structure 110. As illustrated, the ferroelectric material 114 is also between the gate stack 104 and metallization structure 112 on a fifth portion 102E of the body 102. The ferroelectric material 114 is herein referred to as ferroelectric spacer 114.

Body 102 may include any semiconductor material that is suitable for a transistor channel. In an embodiment, the body 102 includes an amorphous, polycrystalline or a crystalline semiconductor. Specific examples of the channel material include silicon, germanium, zinc oxide, indium oxide, tin oxide, gallium oxide, indium gallium zinc oxide (a-IGZO or c-IGZO), copper oxide, nickel oxide, cobalt oxide, indium tin oxide, black phosphorus, indium antimonide, graphene, graphyne, borophene, germanene, silicene, $Si_2BN$, stanene, phosphorene, molybdenite, III-V materials like InAs, InGaAs, GaAs, GaZnON, ZnON, or C-Axis Aligned Crystal (CAAC), transition metal chalcogenides (e.g., sulphur, selenium, or tellurium and at least one of indium, zinc, copper, hafnium, zirconium, aluminum, molybdenum or tungsten). In some embodiments, the material of body 102 can be doped with oxygen vacancies, hydrogen, fluorine, chlorine boron, arsenic, phosphorous, or aluminum, for example.

The ferroelectric spacer 114 includes a material that is in single or poly crystalline form and has a spontaneous polarization over a temperature range. At a Curie temperature, $T_C$, the ferroelectric spacer 114 can undergo a phase transition between an ordered and disordered states, where the dielectric constant can change by orders of magnitude. While a ferroelectric spacer 114 can include a material that is substantially similar to a gate dielectric 106, in exemplary embodiments at least one of the composition or crystallinity is different from that of the gate dielectric 106.

In some examples, the ferroelectric spacer 114 includes hafnium oxide that has an orthorhombic crystal structure. The ferroelectric spacer 114 may also include hafnium oxide doped with one or more of Si, Gd, Y, Sr, La or Al. The dopant concentration may range between 0.1% and 75%. Other examples of ferroelectric spacer 114 includes a non-amorphous material comprising oxygen and one or more of zirconium, aluminum, lanthanum or yttrium. In other embodiments the ferroelectric spacer 114 includes PZT, BaTiO3 or $HfZrO_2$.

As illustrated body portions 102D and 102E under the ferroelectric spacer portions 114A and 114B are ungated regions of the transistor 100A. However, charges 116 is induced in the body portions 102D and 102E by the ferroelectric spacer portions 114A and 114B. Charge is induced within body 102 by a combination of spontaneous polarization in the ferroelectric spacer portions 114A and 114B, voltage biasing between the gate stack 104 and the metallization structure 110 or 112, respectively and by the presence of a stray field in body portions 102B and 102C. In the absence of a voltage bias on the gate stack 104 relative to the metallization structure 110 or 112, there is no significant charge current in the body portions 102D or 102E, even though spontaneous polarization in the ferroelectric material may lead to image charges in body portion 102D or 102E.

In the illustrative embodiment, the metallization structure 110 and 112 each have a tapered profile. Tapered profile results in gaps, $D_{SM1}$ and $D_{SM2}$ between the ferroelectric spacer portions 114A and 114B and the metallization structures 110 and 112, respectively. The gap is filled by a dielectric 118. While charges 116 is generated in body portions 102D or 102E, near the vicinity of the gate stack 104, there are no charges in the body portions 102F or 102G under the gaps, $D_{SM1}$ and $D_{SM2}$. Because body portions 102F and 102G are not directly under the metallization structure 110 and 112, respectively, body portions 102F and 102G can be a source of external resistance, or $R_{ext}$, when the channel material includes materials that are not sufficiently doped.

$R_{ext}$ may be proportional to a lateral spacing, $D_{SM1}$ between the ferroelectric spacer portions 114A and 114B and the metallization structures 110 and 112, respectively. In the illustrative embodiment, $D_{SM1}$ is dependent on positioning of the metallization structure 110 relative to the ferroelectric spacer portion 114A and $D_{SM2}$ is dependent on positioning of the metallization structure 112 relative to the ferroelectric spacer portion 114B. In the illustrative embodiment, where $D_{SM1}$ and $D_{SM2}$ are non-zero, the ferroelectric spacer 114 has a lateral thickness, $T_{FS}$ that is at least 75% of a spacing, $D_{GM}$, between the gate stack 104 and the metallization structures 110 and 112, respectively. When $T_{FS}$ is at least 75% of $D_{GM}$ $R_{ext}$ may not appreciably affect drive current in transistor 100A because a stray electric field may be sufficient to drive charges in the body portions 102F and 102G. A stray electric field may be generated during biasing between the metallization structures 110 and 112.

The gate dielectric 106 has a vertical thickness, $T_{GD}$ as shown in the illustration. In some embodiments, $T_{FS}$ is greater than a thickness, $T_{GD}$, of the gate dielectric 106. $T_{FS}$ is between 1 nm and 20 nm. In other embodiments, $T_{FS}$ is between 2-5 times a thickness $T_{GD}$, of the gate dielectric 106.

Gate dielectric 106 may be any material suitable for the body 102. In some embodiment, the gate dielectric 106 includes a material that is monoclinic or amorphous. In some such embodiments, the gate dielectric 106 includes oxygen and/or nitrogen and at least one or more of hafnium, zirconium, aluminum, lanthanum, titanium, barium, strontium, yttrium, lead scandium, zinc or silicon.

The gate electrode 108 can be one or more materials suitable for the body 102, for example including metals, alloy, or heavily doped semiconductors. The gate electrode 108 may consist of at least one P-type work function metal or N-type work function metal, depending on whether the transistor is to be a PMOS or an NMOS transistor. In some implementations, the gate electrode 108 may include a stack of two or more metal layers, where one or more metal layers are work function metal layers and at least one metal layer adjacent to the work function metal layer(s) is a sidewall protective layer.

In some embodiments, the gate electrode 108 includes hafnium, zirconium, titanium, tantalum, aluminum, tungsten, cobalt, lanthanum or an alloy of nitrogen and at least one of hafnium nitride zirconium nitride, or carbon and at least one of hafnium, zirconium, titanium, tantalum, and aluminum, or a ternary compound such as TiSiN.

As shown, the transistor 100A also includes a gate metallization structure 120 above and coupled with the gate electrode 108. In an embodiment, the gate metallization structure 120, metallization structure 110 and metallization structure 112 include a material that is highly conductive, for example, tungsten, nickel or cobalt. In other embodiments, the gate metallization structure 120, metallization structure 110 and metallization structure 112 include a liner layer and a fill metal on the liner layer. The liner layer may include, for example, ruthenium or tantalum and a fill metal may include a metal, for example, cobalt, nickel or tungsten.

The dielectric 118 may include a material that has a sufficient dielectric strength, such as silicon and at least one of nitrogen, oxygen or carbon. In an embodiment, the body structure 102 is laterally surrounded by an isolation 124 as shown. The isolation 124 may include a material that has a sufficient dielectric strength, such as silicon and at least one of nitrogen, oxygen or carbon. The body 102 and the isolation 124 are on a substrate 126. In some embodiments, substrate 126 includes silicon, germanium or a mixture of silicon and germanium. In other embodiments, substrate 126 is a dielectric material including silicon and at least one of nitrogen, oxygen or carbon.

Figure 1B:
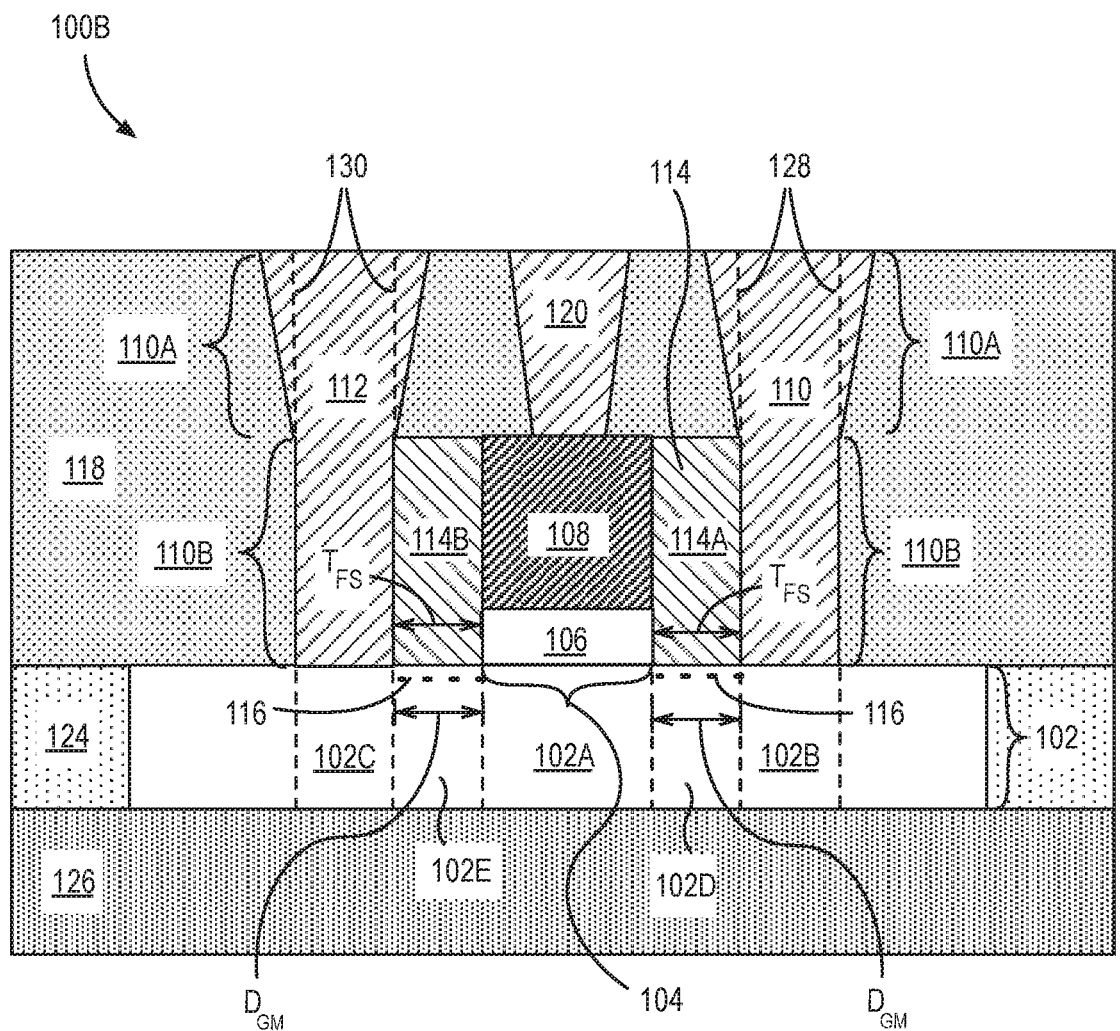
FIG. 1B illustrates a cross-sectional view of a transistor including a ferroelectric spacer and a metallization structure directly adjacent to ferroelectric spacer.

As discussed above, the location and to an extent, the profile of the metallization structures 110 and 112 can influence the size of gaps, $D_{SM1}$ and $D_{SM2}$. In an embodiment, the metallization structures 110 and 112 have vertical profiles as illustrated in the cross-sectional illustration of FIG. 1B. The metallization structures 110 and 112 are also adjacent to the ferroelectric spacer 114A and 114B, respectively as shown. A combination of vertical profile and location mitigates $R_{ext}$.

As shown the metallization structure 110 has a tapered upper section 110A and a vertical section 110B. The vertical section 110B is directly adjacent to and in contact with the ferroelectric spacer portion 114A. In an embodiment, the ferroelectric spacer portion 114A has a lateral thickness, $T_{FS}$ that is substantially equal to a spacing between the gate stack 104 and the first metallization structure, $D_{GM}$, as shown. In the illustrative embodiment, since there are no body portions that are ungated during an 'on-state' of the transistor 100B, $R_{ext}$ may be substantially mitigated.

Also, as shown, the metallization structure 112 has a tapered upper section 112A and a vertical section 112B. The vertical section 112B is directly adjacent to and in contact with the ferroelectric spacer portion 114B. In an embodiment, the ferroelectric spacer portion 114B has a lateral thickness, $T_{FS}$ that is substantially equal to a spacing between the gate stack 104 and the metallization structure 110, $D_{GM}$, as shown. In the illustrative embodiment, since there are no body portions that are ungated during an 'on-state' of the transistor 100B, $R_{ext}$ may be substantially mitigated, when the body 102 includes material that is not sufficiently doped to have free charge carriers under unbiased conditions.

In other embodiments, metallization structures 110 and 112 may each have a profile that is substantially vertical along the entire vertical extent (Y-direction). For example, the metallization structure 110 may have a vertical upper section 110A (indicated by dashed lines 128) and a vertical section 110B and metallization structure 112 may have a vertical upper section 112A (indicated by dashed lines 130) and a vertical section 112B.

Referring again to FIG. 1A, in some embodiments, the metallization structures 110 and 112 may be substantially distant from the ferroelectric spacer 114 (i.e. $D_{SM1}$ and $D_{SM2}$>50 nm), for practical reasons. In other embodiments, the ferroelectric spacer 114 may have a thickness, $T_{FS}$, that is not large enough to occupy the gaps $D_{SM1}$ and $D_{SM2}$. In yet another embodiment, the gaps $D_{SM1}$ and $D_{SM2}$ are substantially greater than lateral thickness, $T_{FS}$ of the ferroelectric spacer 114.

In some such embodiments, the ferroelectric spacer 114 has a shape with a first portion adjacent to the gate stack 104 and a second portion connected to the first portion and directly adjacent to the metallization structure 110 or 112, as shown in the cross-sectional illustration of FIG. 1C. Such a ferroelectric spacer 114 has a substantially "L" shaped structure, as shown. An advantage of a substantial "L" shape is that an L-shaped ferroelectric spacer 114 can be arbitrarily thin and metallization structures 110 and 112 can be distant from the gate stack 104 to prevent shorting with the gate metallization 120. I.e., $D_{SM1}$ or $D_{SM2}$ can be much greater than $T_{FS}$.

As shown, the ferroelectric spacer 114 has a lateral portion adjacent to a sidewall portion. For example, a lateral ferroelectric spacer portion 114C is in contact with a sidewall ferroelectric spacer portion 114A directly adjacent to a sidewall of the gate electrode 108A. As shown, the ferroelectric spacer portion 114A has a lateral thickness, $T_{FS}$ and the lateral ferroelectric spacer portion 114C has a lateral thickness, $T_{LS}$ and a vertical thickness $T_{SV}$. $T_{LS}$ may range between 3 nm and 100 nm, while $T_{FS}$ may range between 1 nm and 20 nm. In an embodiment, $T_{FS}$ is equal to 2 nm and $T_{LS}$ is at least 25 nm. In the illustrative embodiment, $T_{SV}$ is substantially equal to $T_{FS}$.

Similarly, a lateral ferroelectric spacer portion 114D is in contact with a sidewall ferroelectric spacer portion 114C directly adjacent to a sidewall of the gate electrode 108B. As shown, the ferroelectric spacer portion 114B has the lateral thickness, $T_{FS}$ and the lateral ferroelectric spacer portion 114D has the lateral thickness, $T_{LS}$ and the vertical thickness $T_{SV}$. During an on-state of the transistor 100C, charges 116 are driven in the body portions 102E, 102D and 102A.

In some embodiments, a transistor gate stack includes a dielectric layer that is also between the ferroelectric spacer and the gate electrode as shown in the cross-sectional illustration of FIG. 1D. In the illustrative embodiment, gate stack 132 has a gate dielectric 106 that includes three portions 106A, 106B and 106C, where portions 106A, 106B and 106C are contiguous. As shown the first gate dielectric layer portion 106A is between the gate electrode 108 and the ferroelectric portion 114A and the second gate dielectric layer portion 106B is between the gate electrode 108 and the ferroelectric material portion 114B. It is to be appreciated that the gate dielectric layer portions 106A, 106B are materially distinct from the ferroelectric spacer portions 114A and 114B. The third gate dielectric layer portion 106C is between the gate electrode 108 and body portion 102A.

The gate dielectric layer portions 106A and 106B are in contact with gate electrode sidewall 108A, 108B, respectively and each have a lateral thickness, $T_{SGD}$. The gate dielectric layer portion 106C has a vertical thickness, $T_{VGD}$. In an embodiment, $T_{SGD}$ is substantially equal to $T_{VGD}$. The ferroelectric spacer portions 114A and 114A may be thicker or comparable to the thickness, $T_{SGD}$ of the ferroelectric spacer portions 114A and 114B. In an embodiment, $T_{SF}$ is greater than $T_{SGD}$.

While transistor 100D has metallization structures 110 and 112 that are directly adjacent to the ferroelectric spacer portions 114A and 114B, respectively, other configurations are also possible. For example, gate stack 104 in FIGS. 1B and 1C may be replaced by gate 132 depicted in FIG. 1D.

Figure 2:
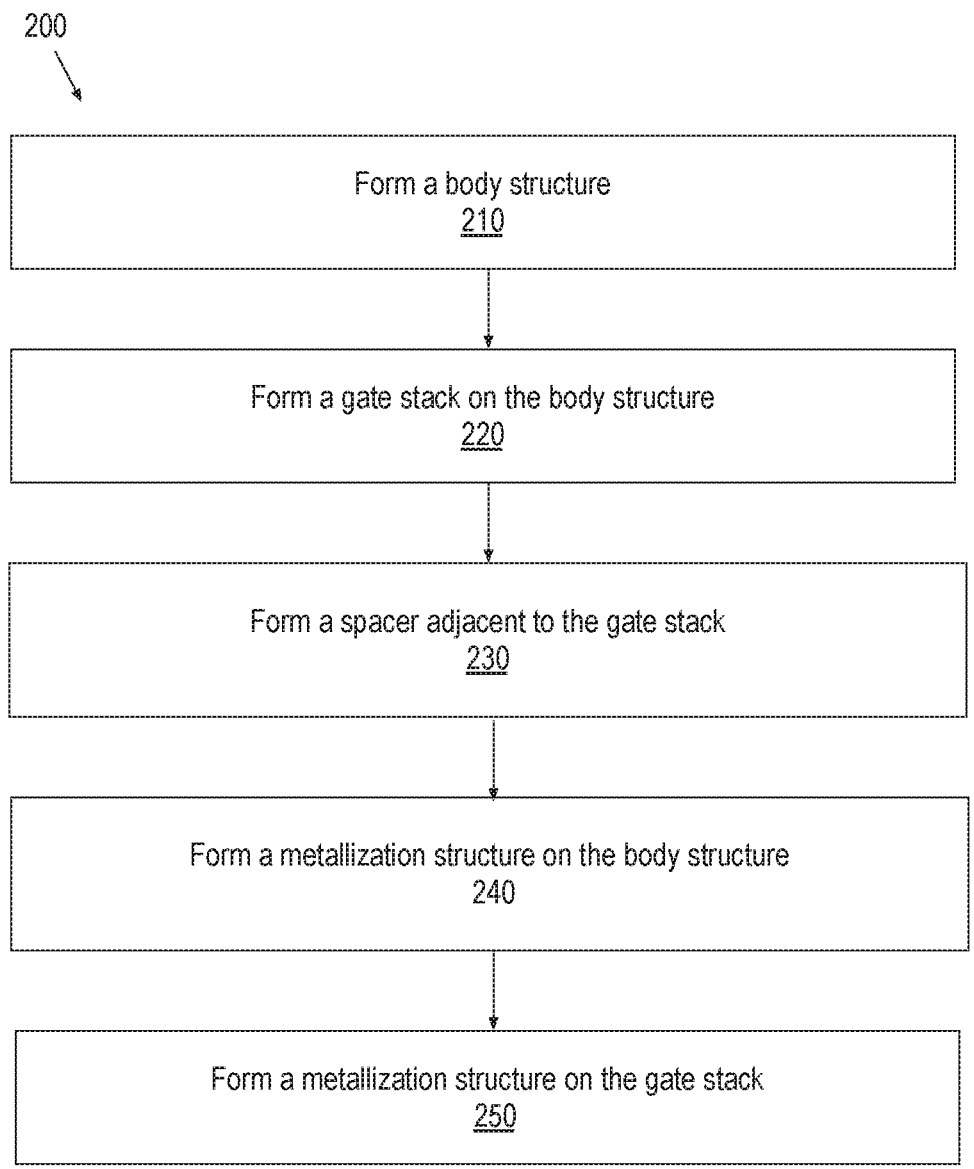
FIG. 2 illustrates a flow diagram for a method to fabricate a transistor with one or more features depicted in FIGS. 1A-1D, in accordance with an embodiment of the present disclosure.

FIG. 2 illustrates a flow diagram for a method 200 to fabricate a transistor with one or more features depicted in FIGS. 1A-1D, in accordance with an embodiment of the present disclosure. The method 200 begins at operation 210 with patterning a body including a semiconductor above a substrate to form a body structure. The method 200 continues at operation 220 with the formation of a gate stack on a first portion of the body. The method 200 continues at operation 230 with the formation of a spacer including a ferroelectric material adjacent to the gate stack on a second area of the body structure. The method 200 continues at operation 240 with the formation of a first metallization structure on a third portion of the body structure and the formation of a second metallization structure on a fourth portion of the body structure, opposite the third portion. The method 200 continues at operation 250 with the formation of a third metallization structure on least a portion of the gate stack.

FIG. 3A illustrates a cross-sectional view of a semiconductor material 302 above a substrate 300. In an embodiment, the semiconductor material 302 includes an amorphous or polycrystalline semiconductor. Specific examples of the channel material include amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), zinc oxide, aluminum doped zinc oxide. In some embodiments, the material of body 102 can be doped with oxygen vacancies, fluorine, chlorine or aluminum. In an embodiment, the semiconductor material 302 is deposited to a thickness between 10 nm and 50 nm. A mask 304 is formed on an uppermost surface 302A of the semiconductor material 302. The mask 304 may be formed by a lithographic process.

In an embodiment, the substrate 300 includes silicon and at least one of nitrogen, oxygen or carbon. In other embodiments, substrate 300 includes silicon, germanium or a mixture of silicon and germanium.

FIG. 3B illustrates the structure of FIG. 3A following the process to pattern the semiconductor material 302 and formation of a dielectric 306 on the patterned semiconductor material 302. In an embodiment, a plasma etch process is utilized to pattern the semiconductor material 302 to form the body structure 102. When the mask 304 includes a photoresist material, the mask 304 is removed prior to deposition of the dielectric 306 but after the plasma etch process. In an embodiment, dielectric 306 includes silicon and at least one or more of oxygen, nitrogen or carbon. In an embodiment, dielectric 306 is blanket deposited on the body structure 102 and on portions of the substrate 300 using a plasma enhanced chemical vapor deposition (PECVD) or a chemical vapor deposition (CVD) process.

FIG. 3C illustrates a cross-sectional view of the structure of FIG. 3B following the process of forming an isolation 306 around the body structure 102. After deposition, the dielectric 306 may be planarized. A planarization process is carried out, for example, to remove an excess dielectric 306 from above the body structure 102. The planarization process may include a chemical mechanical polish (CMP) process that forms a planar top surface 102G. In some examples, the CMP process may be halted before the body structure 102 is exposed. The CMP process leaves some dielectric 306 on the body structure 102 as indicated by the dashed line 307. The remaining dielectric may be removed by a wet chemical removal process, in a subsequent operation, selective to the body structure 102.

The planarization process or the combination of planarization and wet chemical removal process forms an isolation 124 adjacent to sidewalls of the body structure 102.

FIG. 3D illustrates a cross-sectional view of the structure of FIG. 3C following the formation of a dummy gate dielectric layer 308 on the substrate 126, the formation of a dummy gate 310 on the dummy gate dielectric layer 308, and the formation of a ferroelectric spacer 114 adjacent to the dummy gate dielectric layer 308 and the dummy gate 310. In an embodiment, a dummy gate dielectric layer 308 is blanket deposited on the body structure 102 and on portions of the isolation 124. Subsequently a layer of dummy gate material is deposited on the dummy gate dielectric layer 308. In an embodiment, the dummy gate dielectric layer 308 includes a layer of silicon dioxide and the dummy gate material includes a layer of material such as polysilicon that may be doped or undoped. In an embodiment, a resist mask is formed on the layer of dummy gate material. The layer of dummy gate material may be patterned by a plasma etch process to form a dummy gate 310. The dummy gate dielectric layer may be patterned using a wet etch process. For example, the wet etch process may remove the dummy gate dielectric layer 308 from the body structure 102, not covered by the dummy gate 310.

A ferroelectric spacer layer is then blanket deposited on the dummy gate 310 and on the body 102 and on portions of the isolation 124. The ferroelectric spacer layer includes a material is the same or substantially the same as the material of the ferroelectric spacer 114.

In an embodiment, ferroelectric spacer 114 is doped with Si or Co after the deposition process. The doping process may be carried out ex-situ in an implanter for example. In another embodiment, ferroelectric spacer 114 is doped with Si or Co during the deposition process. In other embodiments, a physical vapor deposition process is utilized to deposit ferroelectric spacer 114. In one such embodiment, ferroelectric spacer 114 is amorphous as deposited on the body structure and becomes crystalline after a thermal anneal process at process temperatures of above 200 degrees Celsius. In an embodiment, the ferroelectric spacer layer is then patterned using a plasma etch process to form ferroelectric spacer 114 illustrated in FIG. 3D.

FIG. 3E illustrates the structure of FIG. 3D following the deposition of a dielectric 314 on the ferroelectric spacer on the dummy gate 310, on sidewalls of the dummy gate dielectric layer 308, on the body structure 102 and on the isolation 124. In an embodiment, dielectric 314 is blanket deposited using a PECVD process and includes a material that is the same or substantially the same as the material of the dielectric layer 322. In an embodiment, the dielectric 314 is deposited to a thickness of at least 2.5 times the combined thickness of dummy gate dielectric layer 308 and dummy gate 310 to provide sufficient material for a subsequent planarization process.

FIG. 3F illustrates the structure of FIG. 3E following planarization of the dielectric 314, upper portions of the ferroelectric spacer 114 and upper portions of the dummy gate 310. In an embodiment, the planarization process is a chemical mechanical polish (CMP) process. The CMP process is utilized to polish the dielectric 314, the upper portions of the ferroelectric spacer 114 and upper portions of the dummy gate 310. In one embodiment, the CMP process transforms ferroelectric spacer 114 into a ferroelectric spacer 114 having a substantially flat uppermost surface 114E. Furthermore, in one such embodiment, the CMP process results in uppermost dielectric spacer surface 114E, uppermost dummy gate surface 310A and uppermost dielectric layer surface 314A being co-planar or substantially co-planar.

FIG. 3G illustrates the structure of FIG. 3H following removal of the dummy gate 310 and dummy gate dielectric layer 308 selectively to the ferroelectric spacer 114. In an embodiment, dummy gate 310 is removed by an etch process that was utilized to pattern the dummy gate in the first instance and the dummy gate dielectric layer 308 is removed by the wet process utilized in patterning the dummy gate dielectric layer 308, as discussed above. As shown, removal of the dummy gate 310 and the dummy gate dielectric layer 308 creates an opening 316.

FIG. 3H illustrates the structure of FIG. 3G following a deposition of a gate dielectric layer 106 into the opening 316, on a top surface of body structure 102 within opening 316, on sidewalls of ferroelectric spacer 114 within the opening 316, on flat uppermost surface 114E, and on a top or an uppermost dielectric surface 314A. In an embodiment, gate dielectric layer 106 is deposited by an atomic layer deposition process (ALD) process to ensure conformal deposition within the opening 316. A conformal deposition process, for example, may provide a dielectric layer 106 with a thickness at an interface with the substrate 126 that substantially the same as a thickness of the dielectric layer 106 on sidewalls of the ferroelectric spacer 114. The gate dielectric layer 106 may be deposited to a thickness between 1 nm and 20 nm. In an embodiment, gate dielectric layer 106 is a layer of hafnium oxide that is deposited to a thickness in the range of 1 nm-10 nm. In another embodiment, gate dielectric layer 106 is a layer of zirconium oxide that is deposited to a thickness between 1 nm and 10 nm. A conformal deposition process, such as an ALD process is advantageous when depositing films that are 10 nm or more inside of an opening that ranges between 20 nm and 50 nm. In an embodiment, gate dielectric layer 106 is monoclinic or amorphous as deposited.

A gate electrode layer 320 is deposited on the gate dielectric layer 106. In an embodiment, gate electrode layer 320 is blanket deposited by an atomic layer deposition process (ALD) process to ensure conformal deposition in opening 316 and on the gate dielectric layer 106. In other embodiments, a physical vapor deposition process is utilized. In an embodiment, a gate electrode layer 320 having a crystalline texture is deposited on an amorphous gate dielectric layer 106 and the stack is subjected to a thermal anneal at process temperatures above 300 degrees Celsius. In one such embodiment, thermal anneal process transforms an amorphous AFE gate dielectric layer into a tetragonal crystalline structure whose crystallinity is set by the crystallinity of gate electrode layer 320. In an embodiment, a layer of crystalline TiN is deposited on a layer of amorphous hafnium oxide and annealed to form a crystalline hafnium oxide gate dielectric layer 106.

In some embodiments, depositing gate electrode layer 320 may include depositing a stack of two or more conductive layers, where a first conductive layer (work function layer) that is directly on the gate dielectric layer 106 sets the work function of the gate electrode (to be formed), and the remaining one or more conductive layers include fill layers. The fill layers provide protection to the work function electrode during a subsequent planarization process or have a greater electrical conductivity than the work function layer.

FIG. 3I illustrates the structure of FIG. 3H following a planarization process to form a gate stack 104 including a gate electrode 108 and gate dielectric layer 106. In an embodiment, the planarization process includes a CMP process. In an embodiment, the uppermost surfaces of the excess portions of gate electrode layer 320 and excess portions gate dielectric layer 106 away from the opening 316 are removed leaving the gate electrode 108 and gate dielectric layer 106 in the opening 316. In an embodiment, uppermost gate electrode surfaces 108A, uppermost dielectric surface 314A, uppermost ferroelectric surface 114E are co-planar or substantially co-planar with an uppermost surface of the gate dielectric layer 106. Co-planarity is advantageous to minimize height variation between transistors and also to minimize any potential metallization formation issues.

Figure 3J:
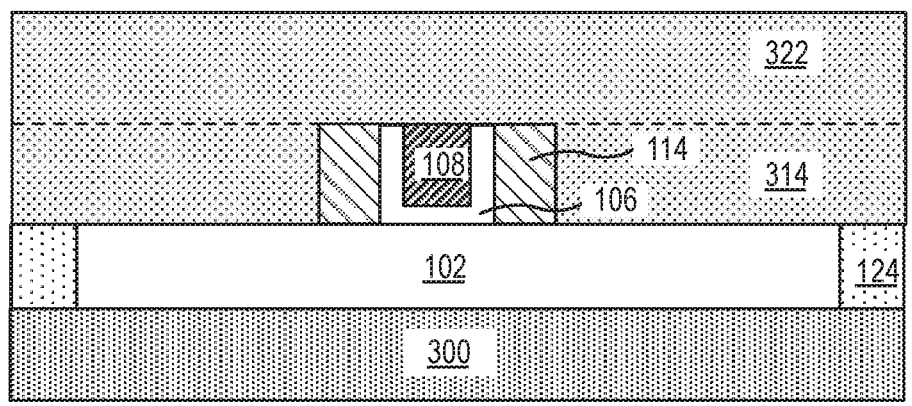
FIG. 3J illustrates the structure of FIG. 3I following the deposition of a dielectric layer on uppermost surfaces of dielectric, ferroelectric spacer, gate electrode and gate dielectric layer.

FIG. 3J illustrates the structure of FIG. 3I following the deposition of a dielectric layer 322 on dielectric 314, ferroelectric spacer 114, gate electrode 110 and gate dielectric layer 106. In an embodiment, dielectric layer 322 includes a silicon dioxide, silicon nitride or carbon doped silicon oxide. In an embodiment, dielectric layer 322 is blanket deposited using a PECVD or CVD process.

Figure 3K:
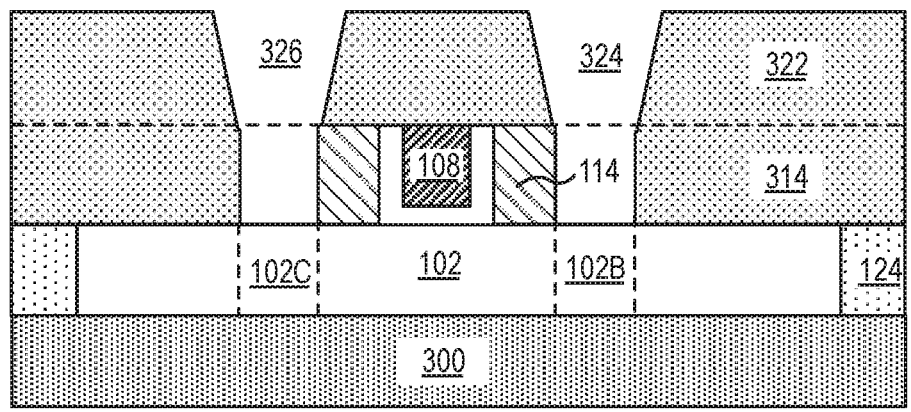
FIG. 3K illustrates the structure of FIG. 3J following the formation of metallization openings and exposing the body portion.

FIG. 3K illustrates the structure of FIG. 3J following the formation of openings 324 and 326 above a body portion 102C and body portion 102B, respectively. In an embodiment, a photoresist mask (not shown) is patterned over the dielectric layer 322, where the pattern defines a location for openings to be formed relative to the body portion 102C and body portion 102B. In one embodiment, a plasma etch process is utilized to form the openings 324 and 326 in the dielectric layer 322, in the dielectric 314, respectively, selectively to the underlying body portion 102C and body portion 102B as shown in the cross-sectional illustration of FIG. 3K. In the illustrative embodiment, the opening 324 has a tapered uppermost portion in the dielectric 322 and a substantially vertical portion adjacent to the ferroelectric spacer 114. In an embodiment, the plasma etch process is selective with respective to the ferroelectric spacer 114 and removes all the dielectric 314 from the sidewall of the ferroelectric spacer 114 in the openings 324 and 326.

Figure 3L:
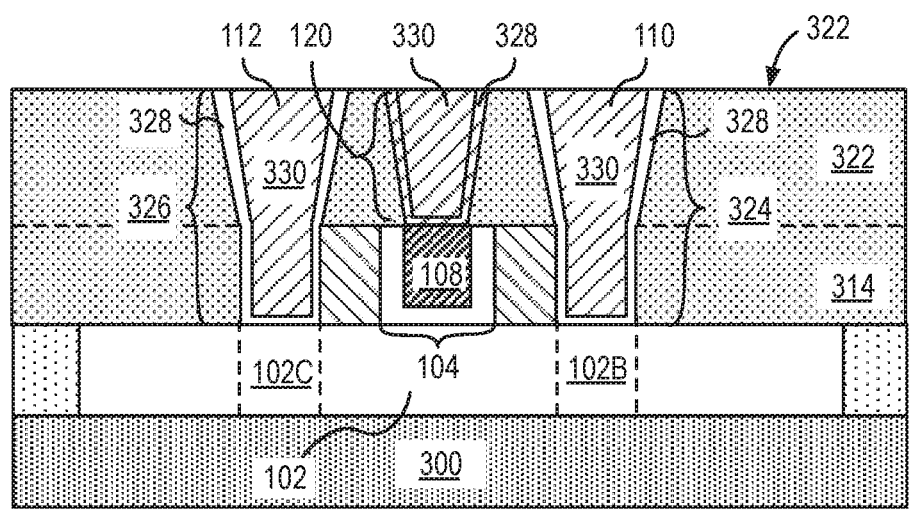
FIG. 3L illustrates the structure of FIG. 3K following the formation of a metallization and a metallization on body portion and on body portion, respectively, and the formation of a gate metallization on gate stack.

FIG. 3L illustrates the structure of FIG. 3K following the formation of a metallization 110 and a metallization 112 on body portion 102B and on body portion 102C, respectively, and the formation of a gate metallization 120 on gate stack 104. In an embodiment, one or more layers of contact metal are deposited inside each of openings 324 and 326 on exposed surfaces of body portion 102C and body portion 102B, respectively. In the illustrative embodiment, the one or more layers of the contact metal are also blanket deposited on the uppermost surface and on sidewalls of dielectric layer 322. In an embodiment, the one or more layers of contact metal are deposited using a plasma enhanced chemical vapor deposition (PECVD) or an ALD process. In an embodiment, a liner layer 328 is deposited first followed by a deposition of a capping layer 330 on the liner layer 328. In an embodiment, where the capping layer 330 is deposited on the liner layer 328, the liner layer 328 including, for example, Ta or Ru is first deposited on the bottom and on the sides of openings 324 and 326. The capping layer 330 including, for example, W, Co or Cu is then deposited on the liner layer 330 to fill the remaining portion of openings 324 and 326. In an embodiment, the liner layer 328 is deposited to a thickness in the range of 2 nm-20 nm, and the capping layer 330 is deposited to fill the remaining portion of each of openings 324 and 326.

A planarization process is then carried out to remove the liner layer 328 and capping layer 330 from the uppermost surface of the dielectric layer 322. In one embodiment, the planarization process includes a chemical mechanical polish (CMP) process. The CMP process removes all of the liner layer 328 and capping layer 330 from the uppermost surfaces of dielectric layer 322. The CMP process leaves the liner layer 328 and capping layer 330 in openings 324 and 326 to form metallization 110 and metallization 112 as shown in the cross-sectional illustration of FIG. 3L.

The gate metallization 120 is formed in a similar manner as metallization 110 and 112. In an embodiment, a plasma etch is utilized to form a gate opening through a mask formed on the dielectric layer 322. The opening exposes gate electrode 108. In an embodiment, a liner layer 328 is deposited into the gate opening and a capping layer 330 is deposited on the liner layer 328. In one embodiment, a planarization process is then carried out to remove the capping layer 330 and liner layer 328 and the from the uppermost surface 322A of the dielectric layer 322 and from uppermost surfaces of the metallization 110 and metallization 112.

In another embodiment, gate metallization 120 may be fabricated prior forming the metallization 110 and metallization 112.

FIG. 4A illustrates a cross-sectional view of a memory cell 400 including a transistor with a ferroelectric spacer 114, such as the transistor 100D and a non-volatile memory element 402 coupled to metallization 110 of the transistor 100D. The memory cell 400 is embedded in a dielectric 404 on a plane above the transistor 100D. Memory cell 400 includes a memory contact 406 coupled with the non-volatile memory element 402, gate interconnect 408 coupled with the gate metallization 120 and an interconnect 410 coupled with the metallization 112. In an embodiment, interconnects 406, 408 and 410, and non-volatile memory element 402 are embedded in a dielectric layer 412. In an embodiment, interconnect 410 and gate interconnect 408 each include a material that is the same or substantially the same as the metallization 110 or 112. In an embodiment, dielectric layer 412 includes a material that is the same or substantially the same as dielectric 118.

Non-volatile memory element 402 may include a magnetic tunnel junction (MTJ) material device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then scaling of MTJ devices can be relaxed. In an embodiment, transistor 100D, which can provide an additional current boost (through increase in drive current), can be advantageously coupled to non-volatile memory element 402 such as an MTJ device to overcome switching current requirements.

FIG. 4B illustrates a cross-sectional view of an example non-volatile memory element 402 that includes a magnetic tunnel junction (MTJ) material device. In the illustrated embodiment, the MTJ device includes a bottom electrode 414, a fixed magnet 416 above the bottom electrode 414, a tunnel barrier 418 on the fixed magnet 416, a free magnet 420 on the tunnel barrier 418, and a top electrode 422 on the free magnet 420. In an embodiment, a dielectric spacer laterally surrounds (not shown) non-volatile memory element 402.

In an embodiment, fixed magnet 416 includes a material and has a thickness sufficient for maintaining a fixed magnetization. For example, fixed magnet 416 may include an alloy such as CoFe and CoFeB. In an embodiment, fixed magnet 416 includes $Co_{100-x-y}Fe_xB_y$, where X and Y each represent atomic percent such that X is in the range of 50-80 and Y is in the range of 10-40, and the sum of X and Y is less than 100. In an embodiment, X is 60 and Y is 20. In an embodiment, fixed magnet 416 is FeB, where the concentration of boron is between 10 and 40 atomic percent of the total composition of the FeB alloy. In an embodiment, the fixed magnet 416 has a thickness that is in the range of 1 nm to 2.5 nm.

In an embodiment, tunnel barrier 418 is composed of a material suitable for allowing electron current having a majority spin to pass through tunnel barrier 418, while impeding, at least to some extent, electron current having a minority spin from passing through tunnel barrier 418. Thus, tunnel barrier 418 (or spin filter layer) may also be referred to as a tunneling layer for electron current of a particular spin orientation. In an embodiment, tunnel barrier 418 includes a material such as, but not limited to, magnesium oxide (MgO) or aluminum oxide ($Al_2O_3$). In an embodiment, tunnel barrier 418 including MgO has a crystal orientation that is (001) and is lattice matched to free magnet 420 below tunnel barrier 418 and fixed magnet 416 above tunnel barrier 418. In an embodiment, tunnel barrier 418 is MgO and has a thickness in the range of 1 nm to 2 nm.

In an embodiment, free magnet 420 includes a magnetic material such as Co, Ni, Fe or alloys of these materials. In an embodiment, free magnet 420 includes a magnetic material such as FeB, CoFe and CoFeB. In an embodiment, free magnet 420 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 420 is FeB, where the concentration of boron is between 10 and 40 atomic percent of the total composition of the FeB alloy. In an embodiment, free magnet 420 has a thickness that is in the range of 1 nm to 2.5 nm.

In an embodiment, bottom electrode 414 includes an amorphous conductive layer. In an embodiment, bottom electrode 414 is a topographically smooth electrode. In an embodiment, bottom electrode 414 includes a material such as W, Ta, TaN or TiN. In an embodiment, bottom electrode 414 is composed of Ru layers interleaved with Ta layers. In an embodiment, bottom electrode 414 has a thickness in the range of 20 nm-50 nm. In an embodiment, top electrode 422 includes a material such as W, Ta, TaN or TiN. In an embodiment, top electrode 422 has a thickness in the range of 30 nm to 70 nm. In an embodiment, bottom electrode 414 and top electrode 422 are the same metal such as Ta or TiN.

In an embodiment, the MTJ device has a combined total thickness of the individual layers in the range of 60 nm-100 nm and a width in the range of 10 nm and 50 nm.

In an embodiment, non-volatile memory element 402 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100D, that can provide an additional current boost (through increase in drive current), can be advantageously coupled to an RRAM device to provide reliable switching operation.

FIG. 4C illustrates a cross-sectional view of an example non-volatile memory element 402 that includes a resistive random-access memory (RRAM) device. In the illustrated embodiment, the RRAM material stack includes a bottom electrode 424, a switching layer 426 over the bottom electrode 424, an oxygen exchange layer 428 over the switching layer 426, and a top electrode 430 on the oxygen exchange layer 428.

In an embodiment, bottom electrode 424 includes an amorphous conductive layer. In an embodiment, bottom electrode 424 is a topographically smooth electrode. In an embodiment, bottom electrode 424 includes a material such as W, Ta, TaN or TiN. In an embodiment, bottom electrode 424 is composed of Ru layers interleaved with Ta layers. In an embodiment, bottom electrode 424 has a thickness in the range of 20 nm-50 nm. In an embodiment, top electrode 430 includes for example, W, Ta, TaN or TiN. In an embodiment, top electrode 430 has a thickness in the range of 30 nm to 70 nm. In an embodiment, bottom electrode 424 and top electrode 430 include Ta or TiN.

Switching layer 426 may be a metal oxide, for example, including oxygen and atoms of one or more metals, such as, but not limited to Hf, Zr, Ti, Ta or W. In the case of titanium or hafnium, or tantalum with an oxidation state +4, switching layer 426 has a chemical composition, $MO_X$, where O is oxygen and X is or is substantially close to 2. In the case of tantalum with an oxidation state +5, switching layer 426 has a chemical composition, $M_2O_X$, where O is oxygen and X is or is substantially close to 5. In an embodiment, switching layer 426 has a thickness in the range of 1 nm to 5 nm.

Oxygen exchange layer 428 acts as a source of oxygen vacancy or as a sink for $O^{2-}$. In an embodiment, oxygen exchange layer 428 is composed of a metal such as but not limited to, hafnium, tantalum or titanium. In an embodiment, oxygen exchange layer 428 has a thickness in the range of 5 nm to 20 nm. In an embodiment, the thickness of oxygen exchange layer 428 is at least twice the thickness of switching layer 426. In another embodiment, the thickness of oxygen exchange layer 428 is at least twice the thickness of switching layer 426. In an embodiment, the RRAM device has a combined total thickness of the individual layers in the range of 60 nm to 100 nm and width in the range of 10 nm to 50 nm.

Figure 5:
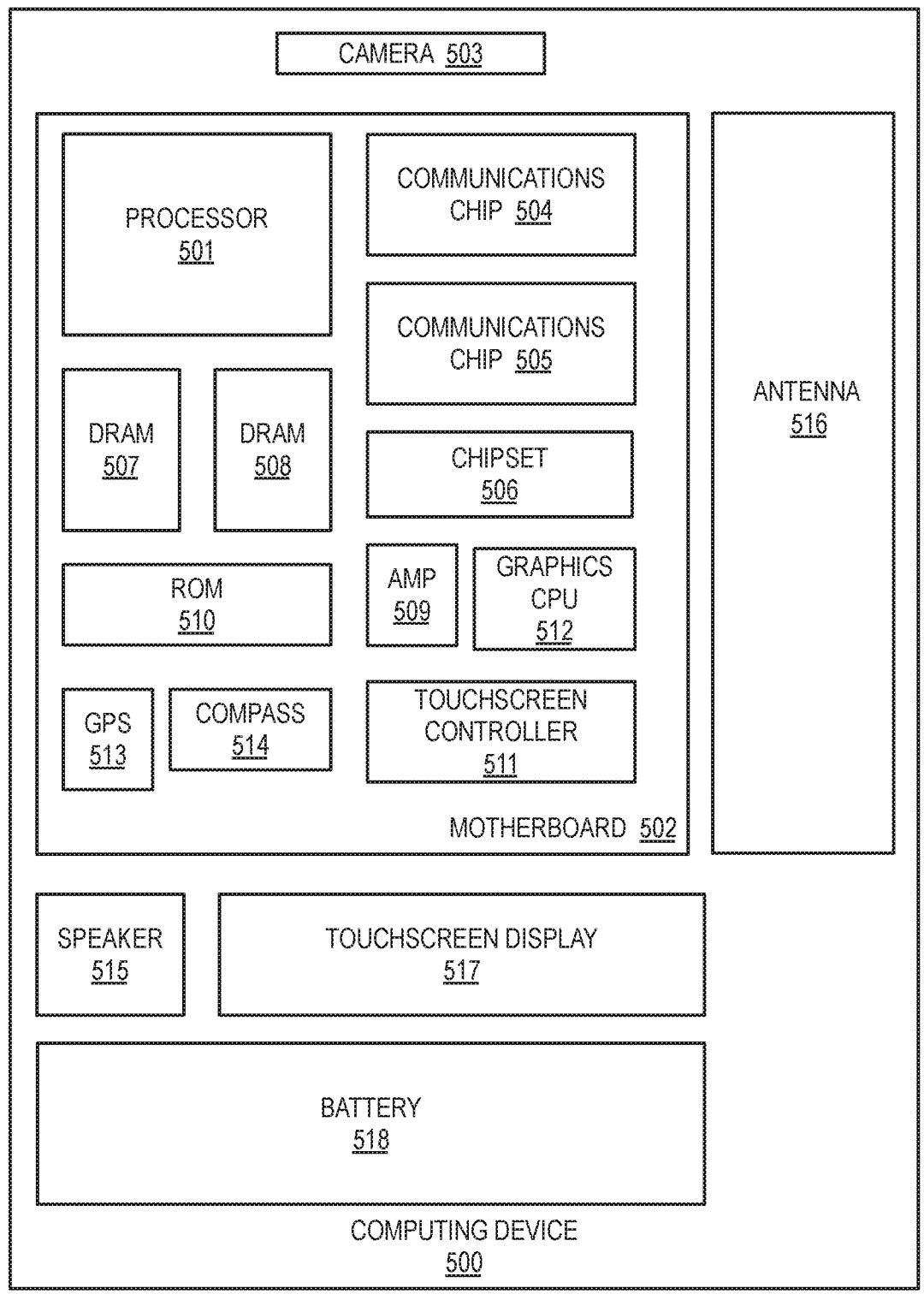
FIG. 5 illustrates a computing device 500 in accordance with embodiments of the present disclosure.

FIG. 5 illustrates a computing device 500 in accordance with embodiments of the present disclosure. As shown, computing device 500 houses a motherboard 502. Motherboard 502 may include a number of components, including but not limited to a processor 501 and at least one communications chip 504 or 505. Processor 501 is physically and electrically coupled to the motherboard 502. In some implementations, communications chip 505 is also physically and electrically coupled to motherboard 502. In further implementations, communications chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 505 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communications chips 504 and 505. For instance, a first communications chip 505 may be dedicated to shorter range wireless communications such as Wi-Fi and Bluetooth and a second communications chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes one or more transistors such as transistors 100A, 100B, 100C or 100D (described in association with FIGS. 1A-1D), interconnect structures, and non-volatile memory (NVM) devices such as magnetic tunnel junction and resistive random-access memory devices. The term "processor" may refer to any device or portion of a device that processes electronic data from registers and/or memory to transform that electronic data into other electronic data that may be stored in registers and/or memory.

Communications chip 505 also includes an integrated circuit die packaged within communication chip 505. In another embodiment, the integrated circuit die of communications chips 504, 505 includes one or more transistors such as transistors 100A, 100B, 100C or 100D (described in association with FIGS. 1A-1D), interconnect structures, and non-volatile memory devices such as magnetic tunnel junction and resistive random-access memory devices. Depending on its applications, computing device 500 may include other components that may or may not be physically and electrically coupled to motherboard 502. These other components may include, but are not limited to, volatile memory (e.g., DRAM) 507, 508, non-volatile memory (e.g., ROM) 510, a graphics CPU 512, flash memory, global positioning system (GPS) device 513, compass 514, a chipset 506, an antenna 516, a power amplifier 509, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of NVM devices coupled with a transistors 100A, 100B, 100C or 100D (described in association with FIGS. 1A-1D). In an embodiment, the NVM devices may include spintronics based devices, magnetic tunnel junction devices, resistive random-access devices. In other embodiments two or three terminal spin orbit torque memory devices may be coupled with one or more transistors such as transistors 100A, 100B, 100C or 100D (described in association with FIGS. 1A-1D).

In various implementations, the computing device 500 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
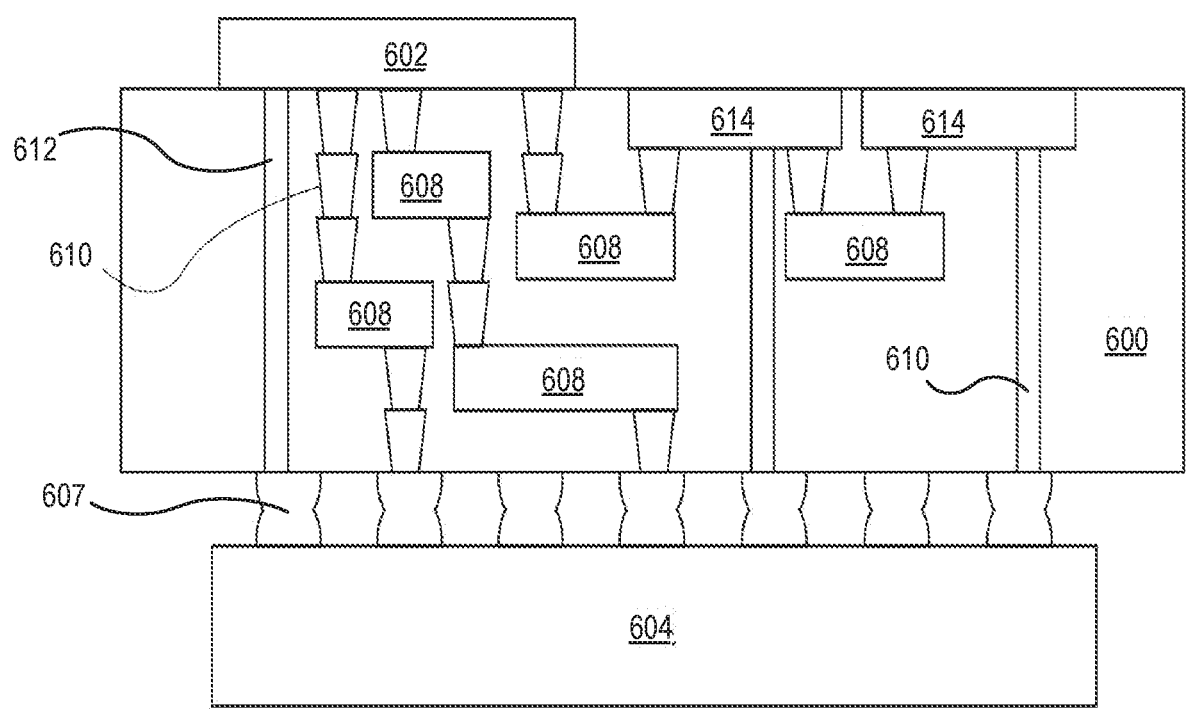
FIG. 6 illustrates an integrated circuit (IC) structure 600 that includes one or more embodiments of the disclosure.

FIG. 6 illustrates an integrated circuit (IC) structure 600 that includes one or more embodiments of the disclosure. The integrated circuit (IC) structure 600 is an intervening substrate used to bridge a first substrate 602 to a second substrate 604. The first substrate 602 may be, for instance, an integrated circuit die. The second substrate 604 may be, for instance, a memory module, a computer mother, or another integrated circuit die. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 607 that can subsequently be coupled to the second substrate 604. In some embodiments, the first and second substrates 602/604 are attached to opposing sides of the integrated circuit (IC) structure 600. In other embodiments, the first and second substrates 602/604 are attached to the same side of the integrated circuit (IC) structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 608 and vias 610, including but not limited to through-silicon vias (TSVs) 612. The integrated circuit (IC) structure 600 may further include embedded devices 614, including both passive and active devices. Such embedded devices 614 include capacitors, decoupling capacitors, resistors, inductors, fuses, diodes, transformers, device structure including transistors, such as transistors 100A, 100B, 100C or 100D (described in association with FIGS. 1A-1D) and transistors 100A, 100B, 100C or 100D (described in association with FIGS. 1A-1D) coupled with a with one at least one nonvolatile memory device such as memory device such as a magnetic tunnel junction or a resistive random access memory device. The integrated circuit (IC) structure 600 may further include embedded devices 614 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 600. In accordance with embodiments of the present disclosure, apparatuses or processes disclosed herein may be used in the fabrication of integrated circuit (IC) structure 600.

Accordingly, one or more embodiments of the present disclosure may relate generally to the fabrication of transistors including a ferroelectric spacer for logic and embedded memory. The microelectronic memory including transistors with a ferroelectric spacer may be non-volatile, wherein the memory can retain stored information even when not powered.

In a first example, a transistor includes a body having a semiconductor and a gate stack on a first portion of the body, where the gate stack includes a gate dielectric on the body and a gate electrode on the gate dielectric. The transistor further includes a first metallization structure coupled to a second portion of the body and a second metallization structure coupled to a third portion of the body, where the first portion is between the second portion and the third portion. The transistor further includes a ferro-electric material on at least a fourth portion of the body, where the ferro-electric material is between the gate stack and the first metallization structure or second metallization structure.

In second examples, for any of the first example, the ferro-electric material is non-amorphous and comprises oxygen and one or more of hafnium, zirconium, aluminum, lanthanum or yttrium, PZT, BaTiO$_3$ or HfZrO$_2$, oxygen and hafnium doped with one or more of Si, Gd, Y, Sr, La or Al.

In third examples, for any of the first through second examples, the ferroelectric material has a composition or crystallinity that is different from that of the gate dielectric.

In fourth examples, for any of the first through third examples, the lateral thickness of the ferroelectric material is greater than a thickness of the gate dielectric between the gate electrode and the body.

In fifth examples, for any of the first through fourth examples, the body has a first thickness from a lower most surface of the body to an uppermost surface of the body that is between 0.1 nm and 50 nm.

In sixth examples, for any of the first through fifth examples, the gate stack has a lateral thickness and wherein the lateral thickness is between 10 nm and 100 nm.

In seventh examples, for any of the first through sixth examples, the ferro-electric material has a lateral thickness that is at least 75% of a spacing between the gate stack and the first metallization structure or second metallization structure.

In eighth examples, for any of the first through seventh examples, the ferro-electric material has a lateral thickness that is substantially equal to a spacing between the gate stack and the first metallization structure or second metallization structure.

In ninth examples, for any of the first through eighth examples, the ferro-electric material has a lateral thickness that is between 1 nm and 20 nm.

In tenth examples, for any of the first through ninth examples, the ferro-electric material includes a sidewall portion adjacent to the gate stack, where the sidewall portion has a lateral thickness in a first direction and a lateral portion adjacent to the sidewall portion and on the body. The lateral portion has a vertical thickness in a second direction, the second direction orthogonal to the first direction and wherein lateral thickness is substantially equal to the lateral thickness.

In eleventh examples, for any of the first through tenth examples, the lateral portion has a lateral thickness in the first direction, wherein the lateral thickness of the lateral portion is greater than the lateral thickness of the sidewall portion.

In twelfth examples, for any of the first through eleventh examples, a portion of the first metallization structure or second metallization structure is in contact with the ferro-electric material.

In a thirteenth example, for any of the first through twelfth examples, the gate dielectric includes a first portion between the gate electrode and the body and a second portion between the gate electrode and the ferro-electric material.

In a fourteenth example, for any of the first through thirteenth examples, the second portion of the gate dielectric has a lateral thickness in a first direction that is substantially equal to a thickness in a second direction of the first portion and wherein the ferro-electric material has a lateral thickness that is greater than the lateral thickness of the second portion.

In fifteenth examples, a semiconductor device includes a transistor. The transistor includes a body having a semiconductor and a gate stack on a first portion of the body, where the gate stack includes a gate dielectric on the body and a gate electrode on the gate dielectric. The transistor further includes a first metallization structure coupled to a second portion of the body and a second metallization structure coupled to a third portion of the body, where the first portion is between the second portion and the third portion. The transistor further includes a ferro-electric material on at least a fourth portion of the body, where the ferro-electric material is between the gate stack and the first metallization structure or second metallization structure. The semiconductor device further includes a memory device above and coupled with the first metallization structure or the second metallization structure.

In sixteenth examples, for any of the fifteenth examples the memory element includes a resistive random-access memory (RRAM) element, where the RRAM element includes a bottom electrode, a switching layer above the bottom electrode and a top electrode above the switching layer.

In seventeenth examples, for any of the fifteenth through sixteenth examples, the memory element includes a magnetic tunnel junction (MTJ) device, where the MTJ device includes a fixed magnet, a tunnel barrier above the fixed magnet and a free magnet above the tunnel barrier.

In eighteenth examples, a method of fabricating semiconductor structure includes providing a substrate and patterning a body above a substrate to form a body structure. The method further includes forming a gate stack, where the forming includes forming a dielectric layer on a first portion of the body structure and forming a gate electrode on the gate dielectric layer. The method further includes forming a spacer including a ferroelectric material adjacent the gate stack on a second portion of the body structure, forming a first metallization structure on a third portion of the body structure and forming a second metallization structure on a fourth portion of the body structure, opposite the third portion. The method further includes forming a third metallization structure on least a portion of the gate stack.

In a nineteenth example, for any of the eighteenth example, where forming the gate stack further includes forming the gate dielectric layer in an opening above the body and depositing a gate electrode material on the gate dielectric layer, wherein the gate dielectric layer has a first portion between the body structure and the gate electrode material and a second portion between the body structure and the spacer.

In twentieth examples, for any of the eighteenth through nineteenth examples, where forming the spacer layer includes blanket depositing a ferroelectric material on the gate stack, on a sidewall of the gate stack and on the body and etching the ferroelectric material to form a spacer adjacent to the sidewall of the gate stack.

In twenty-first examples, for any of the eighteenth through twentieth examples, the ferroelectric material may also include hafnium oxide doped with one or more of Si, Gd, Y, Sr, La or Al, where the dopant concentration may range between 0.1% and 75%.

What is claimed is:

1. A transistor, comprising:
 a body comprising a semiconductor;
 a gate stack on a first portion of the body, the gate stack comprising:
  a gate dielectric on, and in direct contact with, the body; and
  a gate electrode on a first portion of the gate dielectric, wherein a second portion of the gate dielectric is laterally adjacent to, and in direct contact with, a sidewall of the gate electrode;

a first metallization structure coupled to a second portion of the body;

a second metallization structure coupled to a third portion of the body, wherein the first portion is between the second portion and the third portion; and a ferroelectric material on, and in direct contact with, at least a fourth portion of the body, the ferroelectric material between the gate stack and the first metallization structure or second metallization structure, wherein the ferroelectric material is in direct contact with a sidewall of the first or second metallization structure, wherein the ferroelectric material is in direct contact with the second portion of the gate dielectric, and wherein the fourth portion of the body and the ferroelectric material both have a lateral thickness that is substantially equal to a spacing between the gate stack and the first metallization structure or second metallization structure.

2. The transistor of claim 1, wherein the ferroelectric material is non-amorphous and comprises oxygen and one or more of hafnium, zirconium, aluminum, lanthanum or yttrium, PZT, BaTiO3 or $HfZrO_2$, oxygen and hafnium doped with one or more of Si, Gd, Y, Sr, La or Al to a dopant concentration between 0.1% and 75%.

3. The transistor of claim 1, wherein the ferroelectric material has a composition or crystallinity that is different from that of the gate dielectric.

4. The transistor of claim 1, wherein the lateral thickness of the ferroelectric material is greater than a thickness of the gate dielectric between the gate electrode and the body.

5. The transistor of claim 1, wherein the semiconductor comprises a metal and oxygen.

6. The transistor of claim 1, wherein the gate stack has a lateral thickness and wherein the lateral thickness is between 10 nm and 100 nm.

7. The transistor of claim 1, wherein the ferroelectric material has a lateral thickness that is between 2 nm and 20 nm.

8. The transistor of claim 1, wherein the ferroelectric material comprises:

a sidewall portion adjacent to the gate stack, the sidewall portion having a lateral thickness in a first direction;

and a lateral portion adjacent to the sidewall portion and on the body, wherein the lateral portion has a vertical thickness in a second direction, the second direction orthogonal to the first direction and wherein the vertical thickness is substantially equal to the lateral thickness.

9. The transistor of claim 8, wherein the lateral portion has a lateral thickness in the first direction, wherein the lateral thickness of the lateral portion is greater than the lateral thickness of the sidewall portion.

10. The transistor of claim 1, wherein the second portion of the gate dielectric has a lateral thickness in a first direction that is substantially equal to a thickness in a second direction of the first portion and wherein the ferroelectric material has a lateral thickness that is greater than the lateral thickness of the second portion.

11. A semiconductor device comprising:

the transistor of claim 1; and a memory device above and coupled with the first metallization structure or the second metallization structure.

12. The semiconductor device of claim 11, wherein the memory device comprises a resistive random-access memory (RRAM) element, the RRAM element comprising:

a bottom electrode;

a switching layer above the bottom electrode; and a top electrode above the switching layer.

13. The semiconductor device of claim 11, wherein the memory device comprises a magnetic tunnel junction (MTJ) device, the MTJ device comprising:

a fixed magnet;

a tunnel barrier above the fixed magnet; and a free magnet above the tunnel barrier.

* * * * *